(12) United States Patent
Lo

(10) Patent No.: US 10,629,119 B2
(45) Date of Patent: Apr. 21, 2020

(54) DISPLAY APPARATUS

(71) Applicant: Innolux Corporation, Miao-Li County (TW)

(72) Inventor: Min-Hsin Lo, Miao-Li County (TW)

(73) Assignee: Innolux Corporation, Miao-Li County (TW)

( * ) Notice: Subject to any disclaimer, the term of this patent is extended or adjusted under 35 U.S.C. 154(b) by 107 days.

(21) Appl. No.: 15/866,490

(22) Filed: Jan. 10, 2018

(65) Prior Publication Data

US 2018/0197469 A1 Jul. 12, 2018

(30) Foreign Application Priority Data

Jan. 11, 2017 (CN) .......................... 2017 1 0019692

(51) Int. Cl.
*G09G 3/3225* (2016.01)
*G09G 3/3233* (2016.01)
*H01L 27/32* (2006.01)

(52) U.S. Cl.
CPC ......... *G09G 3/3225* (2013.01); *G09G 3/3233* (2013.01); *G09G 2300/0819* (2013.01); *G09G 2300/0842* (2013.01); *G09G 2310/0245* (2013.01); *G09G 2310/0262* (2013.01); *G09G 2310/0264* (2013.01); *G09G 2310/08* (2013.01); *H01L 27/3276* (2013.01)

(58) Field of Classification Search
CPC .. G09G 3/3233; G09G 3/3225; G09G 3/3208; G09G 2300/0439; G09G 2300/0819; G09G 2300/0842; G09G 2310/0245; G09G 2310/08; G09G 2310/0264; G09G 2310/026; H01L 27/3276
See application file for complete search history.

(56) References Cited

U.S. PATENT DOCUMENTS

2010/0079361 A1* 4/2010 Lee ....................... G09G 3/3233
345/77
2017/0140707 A1* 5/2017 Xu ....................... G09G 3/3258

FOREIGN PATENT DOCUMENTS

CN 101083049 12/2007

OTHER PUBLICATIONS

"Office Action of China Counterpart Application", dated Jun. 10, 2019, pp. 1-7.

\* cited by examiner

*Primary Examiner* — Jimmy H Nguyen
(74) *Attorney, Agent, or Firm* — JCIPRNET

(57) ABSTRACT

A display apparatus has a pixel circuit including first, second, and third switches, a transistor, a light-emitting element, and a capacitor. A first terminal of the first switch is coupled to a first voltage line. A first terminal of the second switch is coupled to a second voltage line. A first terminal of the third switch is coupled to a data line. A first terminal of the transistor is coupled to a first power line. A second terminal of the light-emitting element is coupled to a second power line. A first terminal of the capacitor is coupled to a second terminal of the first switch, a second terminal of the third switch, and a control terminal of the transistor. A second terminal of the capacitor is coupled to a first terminal of the light-emitting element, a second terminal of the second switch, and a second terminal of the transistor.

8 Claims, 3 Drawing Sheets

DISPLAY APPARATUS

CROSS-REFERENCE TO RELATED APPLICATION

This application claims the priority benefit of Chinese application serial no. 201710019692.8, filed on Jan. 11, 2017. The entirety of the above-mentioned patent applications is hereby incorporated by reference herein and made a part of this specification.

FIELD OF THE INVENTION

The disclosure relates to a display apparatus; more particularly, the disclosure relates to a pixel circuit in a display apparatus.

DESCRIPTION OF RELATED ART

A pixel circuit of a conventional active matrix organic light-emitting diode (AMOLED) display panel is composed of six or more transistors and one or more capacitors. The conventional pixel circuit having six or more transistors may pose limitations to the development of the display panel with high resolution.

SUMMARY OF THE INVENTION

In an embodiment of the disclosure, a display apparatus is provided. The display apparatus includes a display panel, and the display panel includes a plurality of pixel circuits. At least one of the pixel circuits includes a first switch, a second switch, a third switch, a transistor, a light-emitting element, and a capacitor. A first terminal of the first switch is coupled to a first voltage line of the display panel. A first terminal of the second switch is coupled to a second voltage line of the display panel. A first terminal of the third switch is coupled to a data line of the display panel. A first terminal of the transistor is coupled to a first power line of the display panel. A first terminal and a second terminal of the light-emitting element are respectively coupled to a second terminal of the transistor and a second power line of the display panel. A first terminal of the capacitor is coupled to a second terminal of the first switch, a second terminal of the third switch, and a control terminal of the transistor. A second terminal of the capacitor is coupled to a second terminal of the second switch and the second terminal of the transistor.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF EMBODIMENTS

Figure 1:
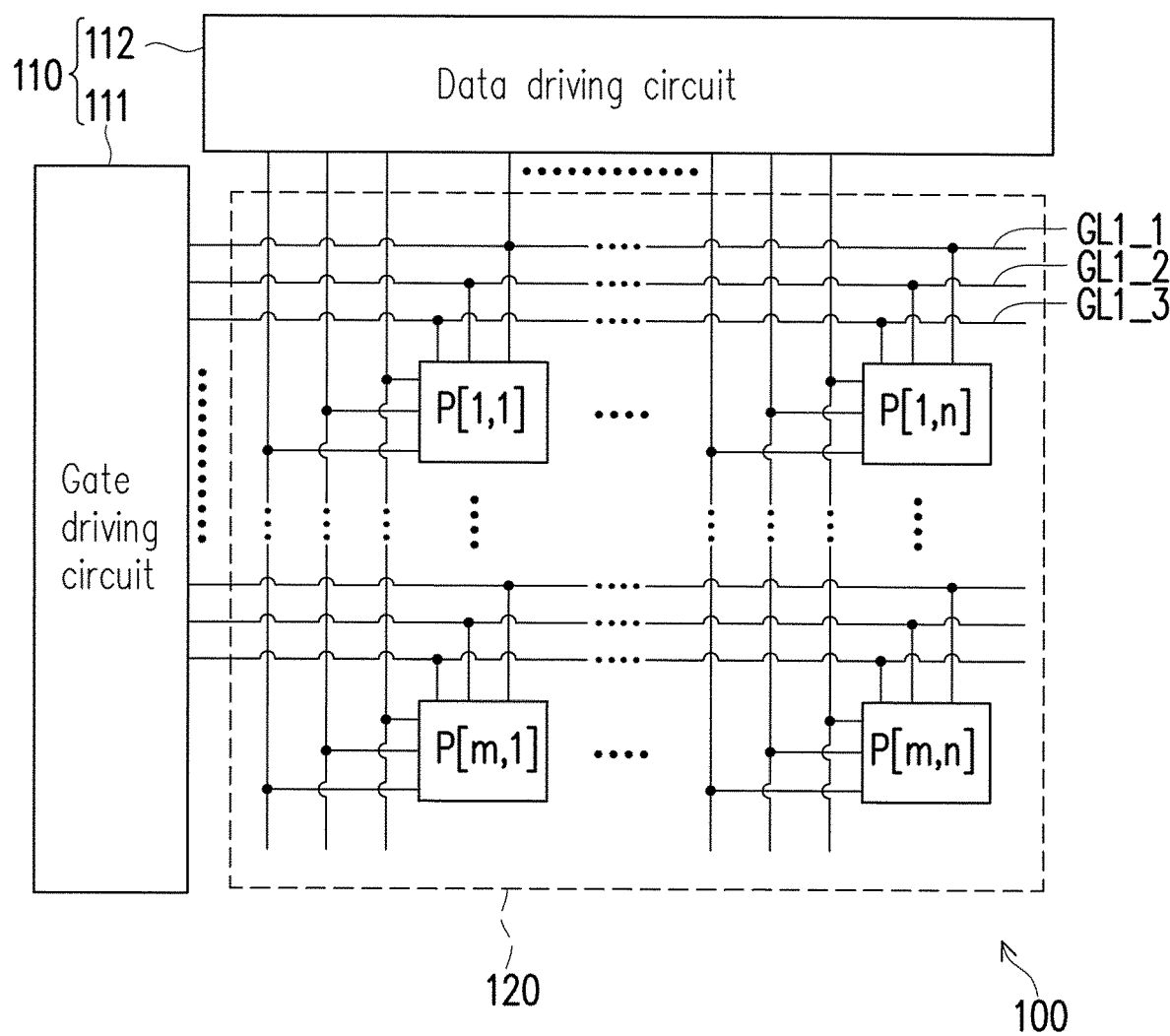
FIG. 1 is a schematic circuit block diagram of a display apparatus according to an embodiment of the disclosure.

The term "couple (or connect)" used throughout this specification (including the claims) may refer to any direct or indirect connection means. For example, if it is described that the first device is coupled (or connected) to the second device, it should be understood that the first device may be directly connected to the second device or indirectly connected to the second device through other devices or certain connection means. Moreover, elements/components/steps with the same reference numerals represent the same or similar parts in the figures and embodiments where appropriate. Descriptions of elements/components/steps with the same reference numerals or terms in different embodiments may be reference for one another.

FIG. 1 is a schematic circuit block diagram of a display apparatus 100 according to an embodiment of the disclosure. As shown in FIG. 1, the display apparatus 100 includes a driving circuit 110 and a display panel 120. The driving circuit 110 is coupled to the display panel 120. According to some embodiments, the driving circuit 110 may include a gate driving circuit 111 and a data driving circuit 112. The gate driving circuit 111 is connected to a plurality of gate lines of the display panel 120, and the data driving circuit 112 is connected to a plurality of data lines of the display panel 120. According to certain design requirements, the gate driving circuit 111 in some embodiments may be directly formed on the display panel 120, so as to constitute a gate driver on panel (GOP) circuit. The display panel 120 includes a plurality of pixel circuits, e.g., the pixel circuit P[1,1], the pixel circuit P[1,n], the pixel circuit P[m,1], and the pixel circuit P[m,n], as shown in FIG. 1. The driving circuit 110 may drive/control the pixel circuits of the display panel 120, such that the display panel 120 may display the corresponding image.

Figure 2:
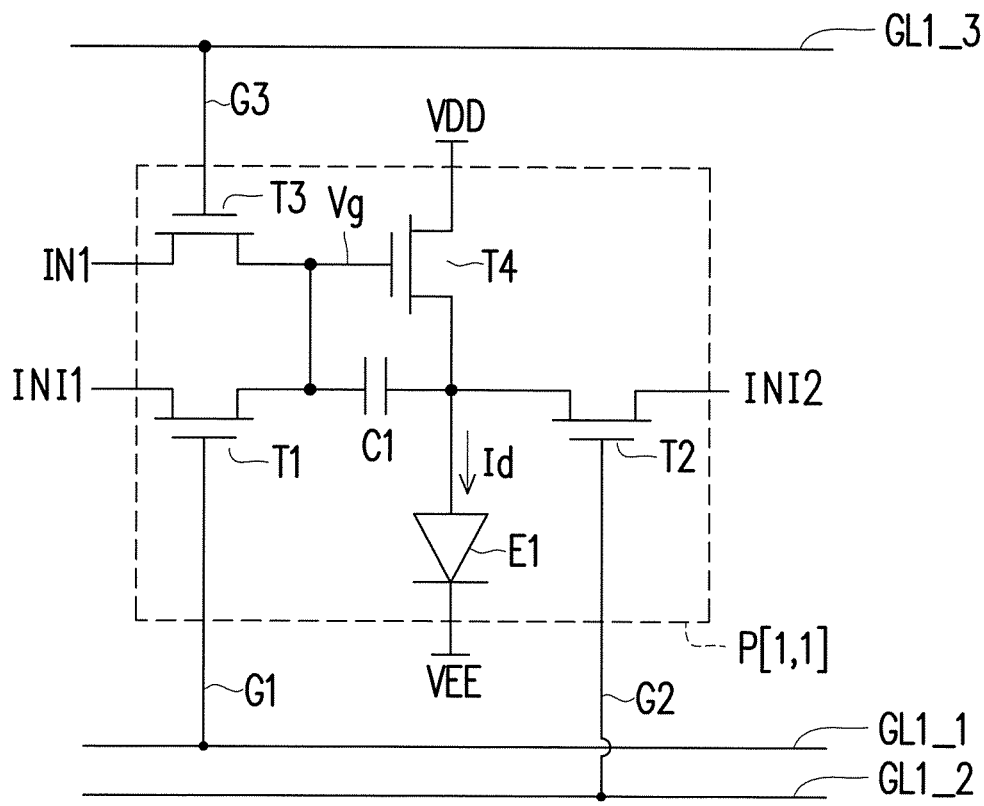
FIG. 2 is a schematic circuit diagram illustrating the pixel circuit depicted in FIG. 1 according to an exemplary embodiment of the disclosure.

FIG. 2 is a schematic circuit diagram illustrating the pixel circuit P[1,1] depicted in FIG. 1 according to an exemplary embodiment of the disclosure. The descriptions of other pixel circuits (e.g., the pixel circuit P[1,n], the pixel circuit P[m,1], and the pixel circuit P[m,n]) may be derived from the descriptions of the pixel circuit P[1,1] and thus will not be further explained hereinafter.

With reference to FIG. 2, the pixel circuit P[1,1] includes a first switch T1, a second switch T2, a third switch T3, a transistor T4, a light-emitting element E1, and a capacitor C1. In the present embodiment, the transistor T4 is an n-channel metal oxide semiconductor (NMOS) transistor. In other embodiments, the transistor T4 may be a p-channel metal oxide semiconductor (PMOS) transistor or another transistor of another type. A first terminal (e.g., the drain) of the transistor T4 is coupled to a first power line VDD of the display panel 120. A first terminal of the light-emitting element E1 is coupled to a second terminal (e.g., the source) of the transistor T4. A second terminal of the light-emitting element E1 is coupled to a second power line VEE of the display panel 120. A voltage of the first power line VDD and a voltage of the second power line VEE may be determined according to the design requirements. For instance, in the embodiment shown in FIG. 1, the voltage of the first power line VDD may be higher than the voltage of the second power line VEE, the first terminal of the light-emitting element E1 may be the anode of the light-emitting diode (LED), and the second terminal of the light-emitting element E1 may be a cathode of the LED. Based on the design requirements, the light-emitting element E1 in different embodiments may be an organic LED (OLED), a micro LED, or any other light-emitting element/circuit. Hence, when the transistor T4 is turned on, the driving current Id may flow from the first power line VDD to the second power line VEE through the transistor T4 and the light-emitting element E1. In other embodiments of the disclosure, the voltage of the first power line VDD may be lower than the voltage of the second power line VEE, the first terminal of the light-emitting element E1 may be the cathode of the LED, and the second terminal of the light-emitting element E1 may be the anode of the LED. Hence, when the transistor T4 is turned on, the driving current Id may flow from the second power line VEE to the first power line VDD through the light-emitting element E1 and the transistor T4.

As shown in FIG. 2, the driving current Id may determine the brightness of the light-emitting element E1. Owing to the control of the voltage Vg at the control terminal (e.g., the gate) of the transistor T4, the driving current Id may be adjusted. The transistors T4 of different pixel circuits often have different threshold voltages Vt, and the difference in the threshold voltages Vt may pose an impact on the display image quality of the display panel 120. The pixel circuit P[1,1] shown in FIG. 2 may self-compensate the factor of the threshold voltage Vt, which will be elaborated hereinafter.

A first terminal of the first switch T1 is coupled to a first voltage line INI1 of the display panel 120. A first terminal of the second switch T2 is coupled to a second voltage line INI2 of the display panel 120. A first terminal of the third switch T3 is coupled to a data line IN1 of the display panel 120. A first terminal of the capacitor C1 is coupled to a second terminal of the first switch T1, a second terminal of the third switch T3, and a control terminal of the transistor T4. A second terminal of the capacitor C1 is coupled to a second terminal of the second switch T2 and a second terminal of the transistor T4. In the embodiment shown in FIG. 2, the first switch T1, the second switch T2, and the third switch T3 are n-type transistors, respectively, e.g., NMOS transistors. In other embodiments, the first switch T1, the second switch T2, and the third switch T3 may be p-type transistors (e.g., PMOS transistors), transmission gates, or other switching elements/circuits.

Figure 3:
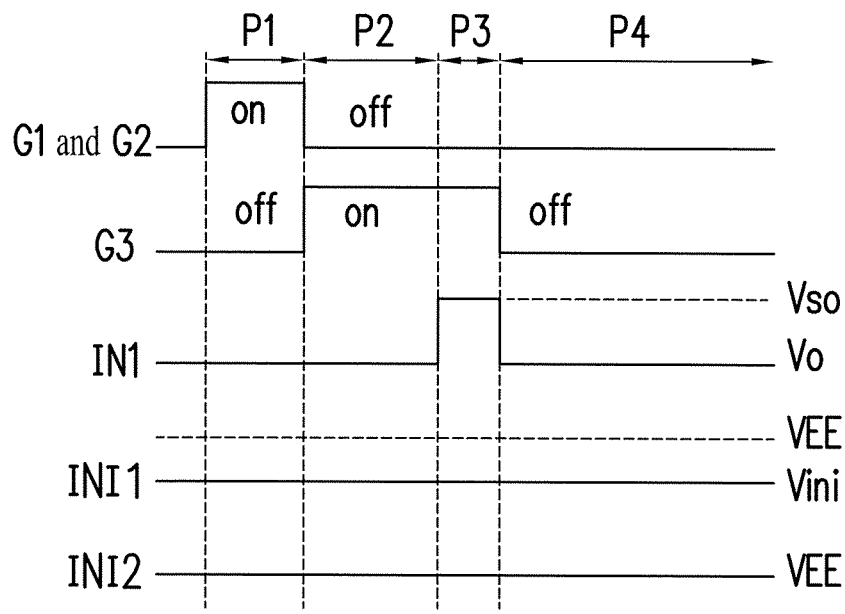
FIG. 3 is a schematic diagram illustrating signal timing of the pixel circuit depicted in FIG. 2 according to an exemplary embodiment of the disclosure.

FIG. 3 is a schematic diagram illustrating signal timing of the pixel circuit P[1,1] depicted in FIG. 2 according to an exemplary embodiment of the disclosure. The horizontal axis shown in FIG. 3 represents time. In the embodiment shown in FIG. 3, the second voltage line INI2 may be the second power line VEE, and an initialization voltage Vini of the first voltage line INI1 is lower than the voltage of the second power line VEE. The voltage of the first power line VDD, the voltage of the second power line VEE, and/or the initialization voltage Vini of the first voltage line INI1 may be determined according to the design requirements. For instance, the voltage of the second power line VEE may be set as −2V, −3V, or another voltage value, and the initialization voltage Vini may be obtained by subtracting 1V (or another voltage value in real number) from VEE.

With reference to FIG. 2 and FIG. 3, the control terminal of the first switch T1 is controlled by a control signal G1, the control terminal of the second switch T2 is controlled by a control signal G2, and the control terminal of the third switch T3 is controlled by a control signal G3. The driving circuit 110 may transmit the control signals G1, G2, and G3 to the pixel circuit P[1,1] through at least one of the gate lines of the display panel 120. For instance, the driving circuit 110 may transmit the control signals G1, G2, and G3 to the pixel circuit P[1,1] respectively through the gate lines GL1_1, GL1_2, and GL1_3, which should not be construed as a limitation to the disclosure. According to the design requirements, in the embodiment shown in FIG. 3, the control signals G1 and G2 may be the same signal; that is, the driving circuit 110 may transmit the control signal G1 (i.e., the control signal G2) to the first switch T1 and the second switch T2 through the same gate line (the gate lines GL1_1 and GL1_2 may be the same gate line).

The driving circuit 110 may transmit a reference voltage Vo to the data line IN1 during an initialization (reset) period P1. The reference voltage Vo may be determined according to the design requirements. For instance, the reference voltage Vo may be 0.2V, 1V, or any other fixed voltage, which should not be construed as a limitation to the disclosure. During the initialization period P1, the first switch T1 and the second switch T2 are turned on, and the third switch T3 is turned off. Hence, the charges of the capacitor C1 may be removed/reset during the initialization period P1. Besides, the voltage Vg at the control terminal of the transistor T4 is pulled down to the initialization voltage Vini, and the voltage at the first terminal of the light-emitting element E1 is pulled down to VEE. The initialization voltage Vini may turn off the transistor T4, and therefore the light-emitting element E1 does not emit light during the initialization period P1.

After the initialization period P1 ends, the compensation period P2 starts. During the compensation period P2, the first switch T1 and the second switch T2 are turned off, the third switch T3 is turned on, and the voltage of the data line IN1 is the reference voltage Vo. Since the voltage Vg at the control terminal of the transistor T4 is pulled up to Vo, and the source voltage of the transistor T4 is VEE, the transistor T4 is turned on. The turned-on transistor T4 pulls up the source voltage of the transistor T4 from VEE. When the source voltage of the transistor T4 is pulled up to Vo−Vt, the transistor T4 is turned off. At this time, the voltage difference between the two terminals of the capacitor C1 is the threshold voltage Vt. Hence, the pixel circuit P[1,1] may find the factor of the threshold voltage Vt by itself during the compensation period P2 and preserve/keep the factor of the threshold voltage Vt in the capacitor C1. During the compensation period P2, the voltage difference between the two terminals of the light-emitting element E1 is controlled to be lower than the threshold voltage of the light-emitting element E1 (normally the threshold voltage of an organic light-emitting diode may be within a range from 3V to 4V), and hence the light-emitting element E1 does not emit light during the compensation period P2.

After the compensation period P2 ends, the data write-in period P3 starts. The driving circuit 110 may transmit a data voltage Vso of the pixel circuit P[1,1] to the data line IN1 during the data write-in period P3. During the data write-in period P3, the first switch T1 and the second switch T2 are turned off, and the third switch T3 is turned on. Since the third switch T3 is turned on, the data voltage Vso of the pixel circuit P[1,1] may be transmitted to the control terminal of the transistor T4. At this time, the source voltage of the transistor T4 is $Vo-Vt+\delta V$, wherein $\delta V=(Vso-Vo)/f$, and f is a characteristic parameter of the parasitic capacitance associated with the light-emitting element E1. At this time, the driving current Id is $K(Vgs-Vt)^2=K[Vso-(Vo-Vt+\delta V)-Vt]^2=K(Vso-Vo-\delta V)^2$, wherein K is a constant, and Vgs is a gate-source voltage of the transistor T4. It can be observed from the equation of the driving current Id that the factor of the threshold voltage Vt has been removed. Hence, the pixel circuit P[1,1] shown in FIG. 2 may self-compensate the factor of the threshold voltage Vt. During the data write-in period P3, the compensated driving current Id output by the transistor T4 may drive the light-emitting element E1 to emit the light with the corresponding brightness.

After the data write-in period P3 ends, the light-emitting period P4 starts. The driving circuit 110 may transmit the reference voltage Vo to the data line IN1 during the light-emitting period P4. During the light-emitting period P4, the first switch T1, the second switch T2, and the third switch T3 are turned off. Since both the first switch T1 and the third switch T3 are turned off, the data voltage Vso of the pixel circuit P[1,1] may be preserved in the capacitor C1. During the light-emitting period P4, the capacitor C1 can keep the gate-source voltage Vgs of the transistor T4, such that the transistor T4 can preserve the compensated driving current Id. The light-emitting element E1 can continuously emit light with the corresponding brightness because of the compensated driving current Id.

Figure 4:
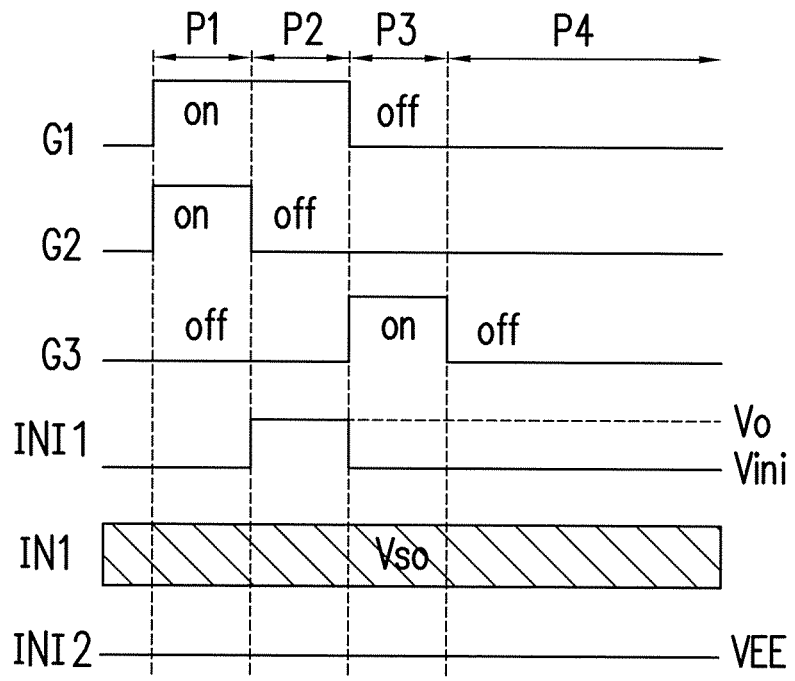
FIG. 4 is a schematic diagram illustrating signal timing of the pixel circuit depicted in FIG. 2 according to another exemplary embodiment of the disclosure.

FIG. 4 is a schematic diagram illustrating signal timing of the pixel circuit P[1,1] depicted in FIG. 2 according to an exemplary embodiment of the disclosure. The horizontal axis shown in FIG. 4 represents time. In the embodiment shown in FIG. 4, the second voltage line INI2 may be the second power line VEE. The driving circuit 110 may transmit the data voltage to the data line IN1. With reference to FIG. 2 and FIG. 4, the control terminal of the first switch T1 is controlled by a control signal G1, the control terminal of the second switch T2 is controlled by a control signal G2, and the control terminal of the third switch T3 is controlled by a control signal G3. The driving circuit 110 may transmit the control signals G1, G2, and G3 to the pixel circuit P[1,1] through different gate lines GL1_1, GL1_2, and GL1_3 of the display panel 120.

The driving circuit 110 may transmit the initialization voltage Vini to the first voltage line INI1 during the initialization (reset) period P1. The initialization voltage Vini may be determined according to the design requirements. For instance, the initialization voltage Vini may be lower than the voltage of the second power line VEE, which should however not be construed as a limitation to the disclosure. During the initialization period P1, the first switch T1 and the second switch T2 are turned on, and the third switch T3 is turned off. Hence, the charges of the capacitor C1 may be removed/reset during the initialization period P1. Besides, the voltage Vg at the control terminal of the transistor T4 is pulled down to the initialization voltage Vini, and the voltage at the first terminal of the light-emitting element E1 is pulled down to VEE. The initialization voltage Vini may turn off the transistor T4, and therefore the light-emitting element E1 does not emit light during the initialization period P1.

After the initialization period P1 ends, the compensation period P2 starts. The driving circuit 110 may transmit the reference voltage Vo to the first voltage line INI1 during the compensation period P2. During the compensation period P2, the first switch T1 is turned on, and the second switch T2 and the third switch T3 are turned off. The reference voltage Vo may be determined according to the design requirements. For instance, the reference voltage Vo may be 0.2V, 1V, or any other fixed voltage higher than the initialization voltage Vini, which should not be construed as a limitation to the disclosure. At this time, the factor of the threshold voltage Vt is preserved in the capacitor C1. During the compensation period P2, the voltage difference between the two terminals of the light-emitting element E1 is controlled to be lower than the threshold voltage of the light-emitting element E1, and hence the light-emitting element E1 does not emit light during the compensation period P2.

After the compensation period P2 ends, the data write-in period P3 starts. The driving circuit 110 may transmit a data voltage Vso of the pixel circuit P[1,1] to the data line IN1 during the data write-in period P3. The driving circuit 110 may transmit the initialization voltage Vini to the first voltage line INI1 during the data write-in period P3. During the data write-in period P3, the first switch T1 and the second switch T2 are turned off, and the third switch T3 is turned on. The factor of the threshold voltage Vt can be removed from the equation of the driving current Id during the data write-in period P3. Hence, the pixel circuit P[1,1] shown in FIG. 2 may self-compensate the factor of the threshold voltage Vt. During the data write-in period P3, the compensated driving current Id output by the transistor T4 may drive the light-emitting element E1 to emit the light with the corresponding brightness.

After the data write-in period P3 ends, the light-emitting period P4 starts. The driving circuit 110 may transmit the initialization voltage Vini to the first voltage line INI1 during the light-emitting period P4. During the light-emitting period P4, the first switch T1, the second switch T2, and the third switch T3 are turned off. The data voltage Vso of the pixel circuit P[1,1] may be preserved in the capacitor C1 during the light-emitting period P4. That is, the capacitor C1 can keep the gate-source voltage Vgs of the transistor T4, such that the transistor T4 can preserve the compensated driving current Id. The light-emitting element E1 can continuously emit light with the corresponding brightness because of the compensated driving current Id.

Figure 5:
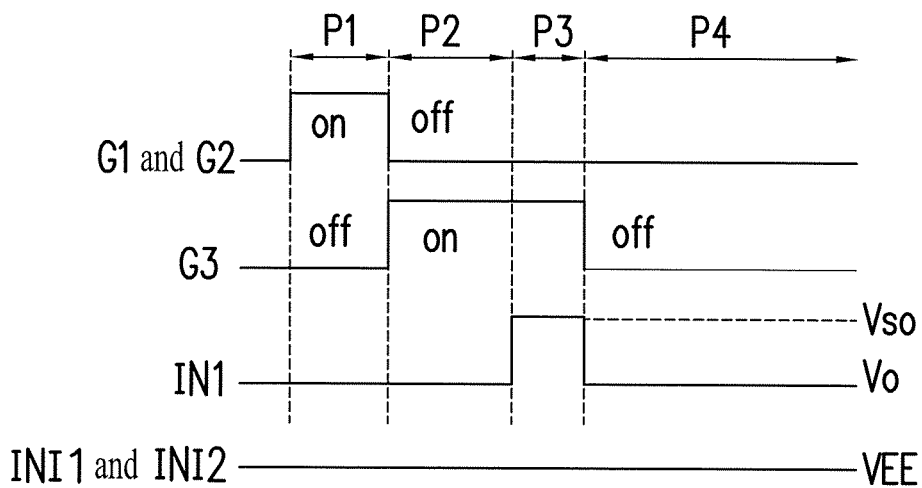
FIG. 5 is a schematic diagram illustrating signal timing of the pixel circuit depicted in FIG. 2 according to still another exemplary embodiment of the disclosure.

FIG. 5 is a schematic diagram illustrating signal timing of the pixel circuit P[1,1] depicted in FIG. 2 according to an exemplary embodiment of the disclosure. The horizontal axis shown in FIG. 5 represents time. In the embodiment shown in FIG. 5, the first voltage line INI1 and the second voltage line INI2 are the second power line VEE. With reference to FIG. 2 and FIG. 5, the control terminal of the first switch T1 is controlled by a control signal G1, the control terminal of the second switch T2 is controlled by a control signal G2, and the control terminal of the third switch T3 is controlled by a control signal G3. The driving circuit 110 may transmit the control signals G1, G2, and G3 to the pixel circuit P[1,1] through at least one of the gate lines of the display panel 120. In the embodiment shown in FIG. 5, the control signals G1 and G2 may be the same signal; that is, the driving circuit 110 may transmit the control signal G1 (i.e., the control signal G2) to the first switch T1 and the second switch T2 through the same gate line (the gate lines GL1_1 and GL1_2 may be the same gate line). The descriptions of the initialization (reset) period P1, the compensation period P2, the data write-in period P3, and the light-emitting period P4 as shown in FIG. 5 may be derived from the descriptions of these periods as illustrated in FIG. 3 and thus will not be further explained hereinafter.

In different application scenarios, the related functions of the driving circuit 110 may be implemented as firmware or hardware by hardware description languages (e.g., Verilog HDL or VHDL) or other suitable programming languages. The programming languages capable of executing the related functions may be deployed as any known computer-accessible media, such as magnetic tapes, semiconductor memories, magnetic disks, or compact disks (e.g., CD-ROMs or DVD-ROMs); alternatively, the programming languages may be transmitted through Internet, wired communications, wireless communications, or other communication media. The programming languages may be stored in an accessible medium of a computer for the processor of the computer to access/execute the programming codes of the programming languages. In addition, the driving circuit 110 provided in this disclosure may be implemented by a combination of hardware and software.

To sum up, the pixel circuit provided in the embodiments of the disclosure is equipped with the first switch, the second switch, the third switch, and the transistor, and the pixel circuit is capable of compensating the threshold voltage. Compared to the conventional pixel circuit, the pixel circuit provided in the embodiments of the disclosure allows the number of switches of the pixel circuit to be reduced. Owing to the reduced number of switches, the display panel provided in the embodiments of the disclosure complies with the development trend of high-resolution technologies.

It will be apparent to those skilled in the art that various modifications and variations can be made to the disclosed embodiments without departing from the scope or spirit of this disclosure. In view of the foregoing, it is intended that the disclosure covers modifications and variations provided that they fall within the scope of the following claims and their equivalents.

What is claimed is:

1. A display apparatus comprising a display panel, the display panel comprising a plurality of pixel circuits, at least one of the pixel circuits comprising:
    a first switch having a first terminal coupled to a first voltage line of the display panel;
    a second switch having a first terminal coupled to a second voltage line of the display panel;
    a third switch having a first terminal coupled to a data line of the display panel;
    a transistor having a first terminal coupled to a first power line of the display panel;
    a light-emitting element having a first terminal and a second terminal respectively coupled to a second terminal of the transistor and a second power line of the display panel; and
    a capacitor having a first terminal and a second terminal, the first terminal of the capacitor being coupled to a second terminal of the first switch, a second terminal of the third switch, and a control terminal of the transistor, the second terminal of the capacitor being coupled to a second terminal of the second switch and the second terminal of the transistor,
    wherein during an initialization period, the first switch and the second switch are turned on, the third switch is turned off, and a voltage of the data line is a reference voltage;
    during a compensation period after the initialization period, the first switch and the second switch are turned off, the third switch is turned on, and the voltage of the data line is the reference voltage;
    during a data write-in period after the compensation period, the first switch and the second switch are turned off, the third switch is turned on, and the voltage of the data line is a data voltage; and
    during a light-emitting period after the data write-in period, the first switch, the second switch, and the third switch are turned off, and the voltage of the data line is the reference voltage.

2. The display apparatus according to claim 1, wherein the first switch, the second switch, and the third switch are n-type transistors, respectively.

3. The display apparatus according to claim 1, wherein the light-emitting device is an organic light-emitting diode.

4. The display apparatus according to claim 1, wherein a voltage of the first voltage line is lower than a voltage of the second voltage line.

5. The display apparatus according to claim 1, wherein the second voltage line is the second power line, and a voltage of the first voltage line is lower than a voltage of the second power line.

6. The display apparatus according to claim 1, wherein both the first voltage line and the second voltage line are the second power line.

7. The display apparatus according to claim 1, wherein a voltage of the first voltage line is an initialization voltage lower than a voltage of the second power line.

8. The display apparatus according to claim 1, wherein the second voltage line is the second power line, and a voltage of the data line is a data voltage.

\* \* \* \* \*